(12) United States Patent
Degroot et al.

(10) Patent No.: US 9,153,503 B2
(45) Date of Patent: Oct. 6, 2015

(54) THIN FILM SOLAR CELL PROCESSING AND TESTING METHOD AND EQUIPMENT

(75) Inventors: Marty W. Degroot, Midland, MI (US); Narayan Ramesh, Midland, MI (US); Stephen J. Marinella, Chandler, AZ (US); Zachary J. Marinella, Chandler, AZ (US); David J. Perkon, Mesa, AZ (US); Jeffrey P. Wilkinson, Tempe, AZ (US)

(73) Assignee: Dow Global Technologies LLC, Midland, MI (US)

( * ) Notice: Subject to any disclaimer, the term of this patent is extended or adjusted under 35 U.S.C. 154(b) by 148 days.

(21) Appl. No.: 13/810,371

(22) PCT Filed: Jul. 29, 2011

(86) PCT No.: PCT/US2011/045816
§ 371 (c)(1),
(2), (4) Date: Jan. 15, 2013

(87) PCT Pub. No.: WO2012/016101
PCT Pub. Date: Feb. 2, 2012

(65) Prior Publication Data
US 2013/0122616 A1 May 16, 2013

Related U.S. Application Data

(60) Provisional application No. 61/369,343, filed on Jul. 30, 2010.

(51) Int. Cl.
*H01L 21/66* (2006.01)
*H01L 31/0392* (2006.01)
*H01L 31/18* (2006.01)
*H01L 31/0465* (2014.01)
*H02S 50/10* (2014.01)

(52) U.S. Cl.
CPC ............ *H01L 22/14* (2013.01); *H01L 31/0392* (2013.01); *H01L 31/03928* (2013.01); *H01L 31/0465* (2014.12); *H01L 31/188* (2013.01); *H01L 31/1876* (2013.01); *H02S 50/10* (2014.12)

(58) Field of Classification Search
CPC ...................... H01L 31/0392; H01L 31/03928; H01L 31/186; H01L 31/188; H01L 31/504; H01L 31/0465; H01L 31/0322; H01L 31/1876; H01L 22/14; H01L 31/392
USPC .................................... 438/14, 84–86, 93, 64
See application file for complete search history.

(56) References Cited

U.S. PATENT DOCUMENTS

| | | | |
|---|---|---|---|
| 4,712,063 A * | 12/1987 | Osterwald et al. | 324/761.01 |
| 2010/0073011 A1 | 3/2010 | Svidenko | |
| 2010/0087030 A1* | 4/2010 | Kim | 438/71 |
| 2010/0178716 A1 | 7/2010 | Zapalac | |

FOREIGN PATENT DOCUMENTS

| | | |
|---|---|---|
| DE | 102 33 855 | 2/2004 |
| EP | 2 159 583 | 3/2010 |
| JP | 2004 022597 | 1/2004 |
| WO | WO 2010/015858 | 2/2010 |

* cited by examiner

*Primary Examiner* — Savitr Mulpuri
(74) *Attorney, Agent, or Firm* — Kagan Binder, PLLC (57) ABSTRACT

A method of providing a plurality of classified photovoltaic articles, including the steps of providing a first photovoltaic element that includes a plurality of photovoltaic articles on a continuous flexible substrate, forming a electrically insulating material on the first photovoltaic element at one or more predetermined locations, separating adjacent photovoltaic articles from each other, determining an efficiency of each photovoltaic article by measuring its current-voltage characteristics, and classifying each photovoltaic article according to its efficiency.

16 Claims, 11 Drawing Sheets

THIN FILM SOLAR CELL PROCESSING AND TESTING METHOD AND EQUIPMENT

PRIORITY

The present application claims priority to International Application No. PCT/US2011/045816, filed on Jul. 29, 2011, which in turn claims priority under 35 U.S.C. §119(e) from the United States Provisional patent application having Ser. No. 61/369,343, filed on Jul. 30, 2010, by Degroot et al. and titled THIN FILM SOLAR CELL PROCESSING AND TESTING METHOD AND EQUIPMENT, wherein the entirety of said patent applications are incorporated herein by reference.

TECHNICAL FIELD

The present invention relates generally to photovoltaic materials used for converting sunlight into electrical power, and more particularly relates to methods and equipment for processing and testing of thin film photovoltaic cells.

BACKGROUND

The field of photovoltaics generally relates to multi-layer materials that convert solar radiation or sunlight energy into direct current (DC) electricity for the generation of electric power. These photovoltaic materials are commonly referred to as solar cells, and can be produced commercially in a thin-film configuration, such as by depositing one or more thin layers of photovoltaic material and supporting layers onto a substrate in a certain pattern and sequence. Thin film solar cells provide several advantages. One such advantage is that these compositions have a high cross-section for absorbing incident light. That is, photovoltaic layers that are very thin can capture a relatively high percentage of incident light. For example, in many thin film solar cell devices, photovoltaic layers may have a thickness in the range of about 1 µm to about 4 µm. These thin layers allow devices that incorporate these layers to be flexible. The characteristic flexibility of thin films further enables the solar cell material comprising numerous devices to be prepared in a continuous fashion, such as on a flexible web. This is in contrast to less flexible solar cells, such as those that comprise crystalline silicon, for example, which are typically fabricated and processed as discrete individual solar cells.

Because a single conventional solar cell typically cannot generate enough electricity for most applications, a number of solar cells can be electrically and physically connected to each other in an arrangement that is referred to as a photovoltaic module or "string". Such modules or strings are designed to supply electricity at a certain voltage, where the electricity produced is directly proportional to the amount of sunlight that strikes the module. Multiple modules can in turn be attached to each other to form an array. In general, the larger the area of a module or array, the more electricity that will be produced. These modules and arrays can be connected in either series or parallel electrical arrangements to produce desired voltage and current combinations. In particular, electrical connections can be made in series to achieve a desired output voltage and/or in parallel to provide a desired amount of current source capability. In addition, a semiconductor junction develops a photo-voltage, while the area and other parameters of the device determine the available current. Commercially available solar panels are therefore designed to have an appropriate area and arrangement to deliver a certain amount of power and optimize other application parameters.

Photovoltaic arrays are often associated with buildings, where these arrays can be integrated into the building structure, mounted onto the building in some way (e.g., attached to the roof structure), or located separately from the building structure but connected by a cable or power supply to the building. In some cases, arrays are built as a part of the construction of a new building, and in other cases, the arrays are retrofitted into existing buildings. For one example, roof tiles have been developed that incorporate photovoltaic cells, where these tiles are used instead of traditional roofing shingles. In another application, solar cells can be incorporated into wall panels of a building, such as panels that can be incorporated into the siding structure or that may be attached to existing siding materials. Such roof tiles and/or wall panels can be incorporated into both domestic and industrial buildings as a primary or secondary source of electrical power for that structure.

As part of the process of fabricating thin film solar cell modules, several processing steps must be carried out in order to prepare the solar cell material for the process of being connected with other cells, which can be referred to as an interconnection process. In order to optimize the performance of the modules, it is desirable to connect cells having similar efficiencies and current generating capacities to each other to provide an overall module or string with the highest power generating capacity. Thus, there is a need to provide thin film solar cell processing and testing equipment and methods to prepare solar cell material for the interconnection process. There is also a need to provide for accurate classification and sorting of cells, so that those cells can subsequently be provided to another operation for connecting these sorted cells to each other.

BRIEF DESCRIPTION OF THE DRAWINGS

The present invention will be further explained with reference to the appended Figures, wherein like structure is referred to by like numerals throughout the several views, and wherein.

SUMMARY

In accordance with the invention, a method of providing a plurality of classified photovoltaic articles is provided, which comprises the steps of providing a first photovoltaic element comprising a plurality of photovoltaic articles on a continuous flexible substrate, forming an electrically insulating material on the first photovoltaic element at one or more predetermined locations, separating adjacent photovoltaic articles from each other, determining an efficiency of each photovoltaic article by measuring its current-voltage characteristics, and classifying each photovoltaic article according to its photoelectric performance. Prior to the step of determining the efficiencies of the articles, the articles can optionally be light-soaked in a light-soaking station, wherein the temperature of the articles during this step can be monitored and controlled, if desired. Whether or not a light-soaking process is used, the electrically insulating material can be cured after it has been formed on the first photovoltaic element. This electrically insulating material may be formed as a multiple droplet array of electrically insulating material, which electrically insulating material can be provided in a liquid form. Alternatively, the electrically insulating material may be formed from a solid material such as an electrically insulating adhesive or tape. With either form of material, the electrically insulating material may deposited on at least one of an edge surface, a top surface, and a bottom surface of the first photovoltaic element. This material can be applied using a multi-axis system, such as a multi-axis robot, and may be applied using either contact or non-contact or solid liquid dispensing processes. The system may optionally comprise equipment for forming a via in the photovoltaic element along one or both of the long edges of the photovoltaic element from the top surface of the photovoltaic element that terminates at a location such that the via provides electrical isolation of the edge of the photovoltaic element.

The above-described process can be simultaneously performed on more than one photovoltaic element, such as by providing additional or larger equipment in each station that performs the above steps in order to accommodate additional photovoltaic elements that comprise a plurality of photovoltaic articles on a continuous flexible substrate. The same or similar steps can be performed with these additional photovoltaic elements to provide additional classified photovoltaic articles.

Additionally in accordance with the invention, a photovoltaic cell processing and classifying system is described herein for providing a plurality of photovoltaic articles from a continuous flexible substrate. The system generally includes a material unwind station for unwinding a continuous flexible substrate from a first material roll, a material dispensing station for applying electrically insulating material on the flexible substrate at predetermined locations, a light soaking or curing station comprising at least one curing element, a singulation station comprising at least one substrate separation element, and a cell testing and sorting station for determining an efficiency of each photovoltaic article by measuring its current-voltage characteristics and classifying each photovoltaic article according to its photoelectrical performance.

DETAILED DESCRIPTION

Referring now to the Figures and initially to FIGS. 1-4, one exemplary embodiment of a photovoltaic cell processing and classifying system 10 is illustrated, in accordance with the invention, which generally includes a material unwind station 20, a liquid material dispensing station 50, a light soaking or curing station 60, and a shear and offload station 80. These stations are designed and arranged for moving a continuous roll of photovoltaic material through several processing steps to provide individual components cut from the roll that are classified and prepared for an interconnection or other processes, as desired.

In general, the steps of the process include providing a raw material roll of photovoltaic material on a continuous flexible substrate to the material unwind station 20. The material is unwound from the roll and provided to the liquid material dispensing station 50. At this station, liquid dielectric or electrically insulating material can be dispensed onto the photovoltaic material in predetermined locations relative to features of the photovoltaic material. The predetermined locations may include forming the electrically insulating material along the entire length of one or both longitudinal edges of the photovoltaic element (e.g., on or adjacent to the edges 72, 74 of the flexible substrate 70 illustrated in FIG. 8). More typically, the electrically insulating material can be formed at discrete predetermined locations, as will be described below.

The liquid material dispensing station 50 may include a vision system that is configured to scan the material as it moves past it to thereby locate positional features on the material. The station 50 may further include a robot that is used for precise dispensing and application of the electrically insulating material. It is also possible that the electrically insulating material is cured or partially cured while it is in this station. The photovoltaic material then moves to the optional light soaking station 60, in which the material can be subjected to certain light intensity and/or temperature changes. The material can then move to the shear and offload station 80, where the photovoltaic material is cut into individual components of predetermined sizes, which may also be referred to as singulated solar cells. The station 80 can further include a vision system configured to scan individual solar cells and locate positional features on those cells to allow for proper alignment of each cell in a solar cell tester. The efficiency of each solar cell can then be measured, and a robot or other device can be used to pick up each classified cell and load or place it in a certain location (e.g., a bin or basket) based on its efficiency. The cell processing and classifying system may also include a system for labeling the individual photovoltaic articles so that they can be uniquely identified. The labeling system may comprise an ink jet or laser marking system for application of a unique identifier such as a bar code.

Although one exemplary order of material processing steps is described above, the steps may alternatively be performed in a different order. For one example, the light soaking step can be performed before the electrically insulating material is dispensed. In another example, the light soaking step can be performed after the material is cut into individual cells.

The rolls of photovoltaic cells may be any photovoltaic cells in a flexible form. Examples include IB-IIIA chalcogenides (e.g. copper indium gallium selenides (CIGS), copper indium sulfide selenides (CISS) and the like), amorphous silicon, cadmium tellurides on flexible substrates, and gallium arsenide cells. The rolls of photovoltaic cells or material discussed herein generally include a continuous flexible substrate onto which multiple thin layers of material are deposited in a particular fashion. The thickness of each layer depends on the choice of materials and on the particular application process chosen for forming each layer. The multiple layers of materials that are deposited on the continuous flexible substrate define multiple photovoltaic articles adjacent to each other along the length of the material.

Figure 18:
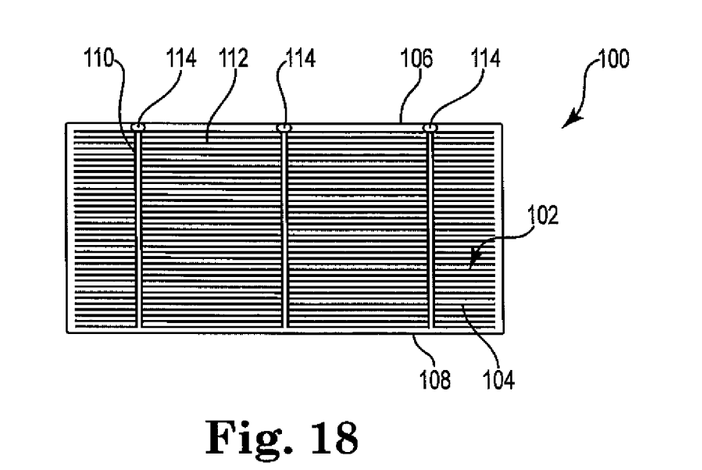
FIG. 18 is a top view of an individual solar cell of the type that can be processed, tested, and classified using the methods and systems of the invention.

When a roll of material is cut into individual cells, as is described below, such a cell can be the same or similar to an exemplary embodiment of such a cell that is illustrated in FIG. 18 as cell 100. Cell 100 includes a substantially planar material having a top surface 102, an opposite bottom surface 104, a first edge 106, and a second edge 108 that is generally opposite the first edge 106. The cells may be cut into identical or similarly sized rectangular pieces, although it is understood that the individual cells can have a different shape than rectangular. In at least one embodiment, the top surface of each cell 100 is generally configured to include a collection grid comprised of one or more relatively narrow conductive strips or buss lines 110, which may be approximately perpendicular to the first and/or second edges 106, 108 of the material. These buss lines 110 may be adjacent to or contiguous with a plurality of grid lines or fingers 112 that extend generally parallel to the direction of the first and/or second edges 106, 108. These lines 112 can be considerably thinner than the buss lines 110. The collection grid is used for the collection of electrons, as is known in the industry for photovoltaic processes. The collection grid can be formed from a wide range of electrically conducting materials, but most desirably are formed from one or more metals, metal alloys, or intermetallic compositions. Exemplary contact materials that can be used for one or more portions of the grid include one or more of silver, aluminum, copper, chromium, nickel, titanium, combinations of these, and the like. In one exemplary embodiment, the grid includes a dual layer construction comprising nickel and silver. In another exemplary embodiment, the grid comprises a conductive silver ink layer.

In one exemplary embodiment, the bottom surface of cell 100 comprises a substrate onto which photovoltaic materials and other active components of the photovoltaic element are deposited. The substrate may be formed from a wide range of flexible materials that allow the formation of a continuous photovoltaic element. These include polymers, metals, metal alloys, intermetallic compositions, paper, woven or non-woven fabrics, combinations of these, and the like. In one embodiment, a conductive substrate such as stainless steel is preferred.

Cell 100 further comprises a photovoltaic absorber layer. In at least one exemplary embodiment, the absorber layer is a chalcogenide-containing absorber layer. The absorber can be a single integral layer or can be formed from one or more layers. The absorber absorbs light energy embodied in the sunlight rays and then photovoltaically converts this light energy into electric energy. The chalcogenide absorber layer can incorporate at least one IB-IIIB-chalcogenide, such as IB-IIIB-selenides, IB-IIIB-sulfides, and IB-IIIB-selenides-sulfides that include at least one of copper, indium, and/or gallium. In many embodiments, these materials can be present in polycrystalline form. Advantageously, these materials can exhibit cross-sections for light absorption that allow the absorber to be very thin and flexible. In exemplary embodiments, an absorber layer may have a thickness in the range from about 1 µm to about 5 and more specifically can be in the range of about 2 µm to about 3 µm. In yet other exemplary embodiments, CMS materials with photovoltaic properties may be represented by the formula $CuIn_{(1-x)}Ga_xSe_{(2-y)}S_y$, where x is 0 to 1 and y is 0 to 2. The copper indium selenides and copper indium gallium selenides can be used. The absorber layer may be formed by any suitable method using a variety of one or more techniques such as evaporation, sputtering, electrodeposition, spraying, sintering, and the like.

In addition to the absorber and top and bottom layers described, cell 100 can further include a number of layers that may include a backside electrical contact region, buffer region, and transparent conducting oxide (TCO) layer. Each of these regions can be a single integral layer or can be formed from one or more layers. The electrical contact layer may be formed from a wide range of electrically conductive materials, including one or more of Cu, Mo, Ag, Al, Cr, Ni, Ti, Ta, Nb, W, combinations of these, and the like. Conductive compositions incorporating Mo may be used in an illustrative embodiment. Cell 100, when based upon chalcogenide materials, can be provided with a heterojunction structure in contrast to silicon-based semiconductor cells that have a homojunction structure. A heterojunction may be formed between the absorber region and the TCO layer buffered by a buffer layer. An optional window layer also may be present. Each of these regions can be a single integral layer or can be formed from one or more layers. The buffer layer generally comprises an n-type semiconductor material with a suitable band gap to help form a p-n junction proximal to the interface between the absorber region and the buffer region. An exemplary buffer layer is CdS.

Referring now to FIGS. 5-10, an exemplary material unwind station 20 is illustrated, which includes a main control enclosure 22 and an equipment enclosure 24. The main control enclosure 22 contains at least some of the electronic and/or pneumatic controls for the unwind station 20 and/or other stations of the cell processing system 10. This enclosure may further include a display screen 26 and one or more push buttons 27 or other external control features that can be manipulated by an operator to control one or more operations of the different stations.

Figures 1, 3:
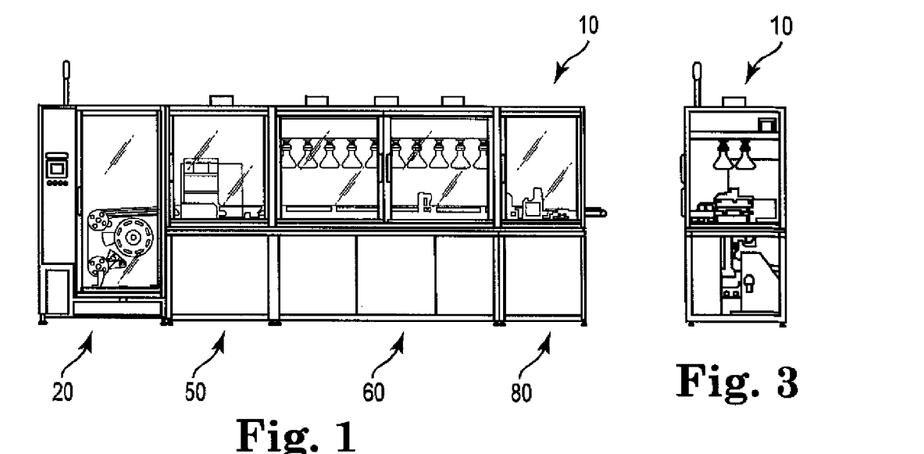
FIG. 1 is a front view of a thin film solar cell processing and classifying system, in accordance with the invention.
FIG. 3 is a side view of the system of FIG. 1.
Figure 2:
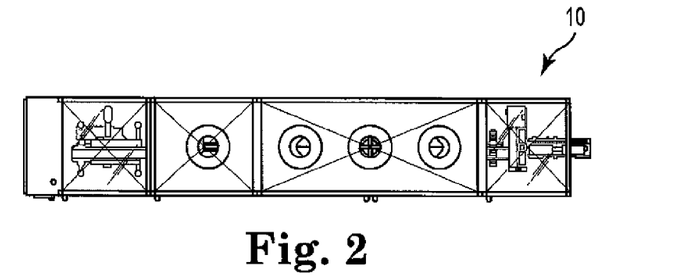
FIG. 2 is a top view of the system of FIG. 1.
Figure 4:
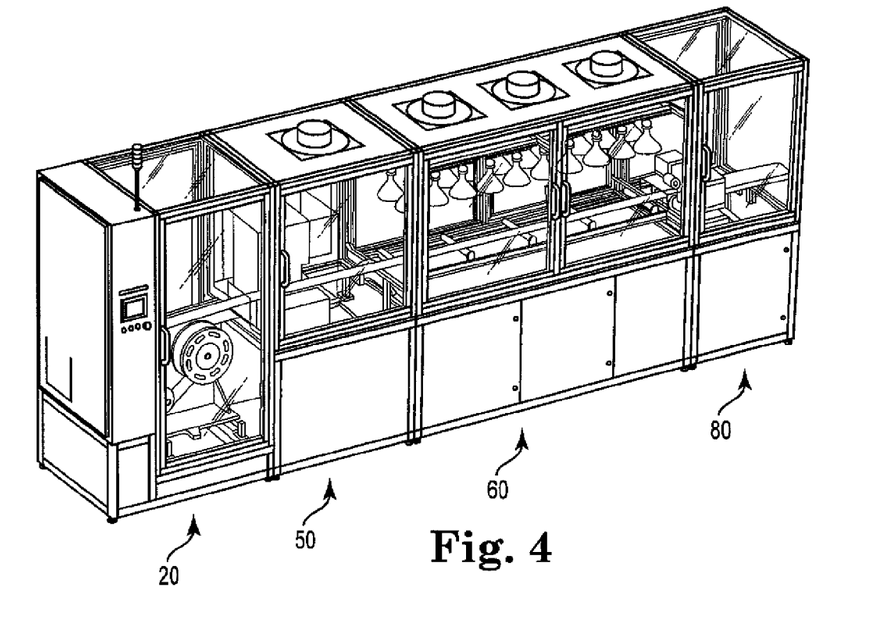
FIG. 4 is a perspective view of the system of FIG. 1.
Figure 5:
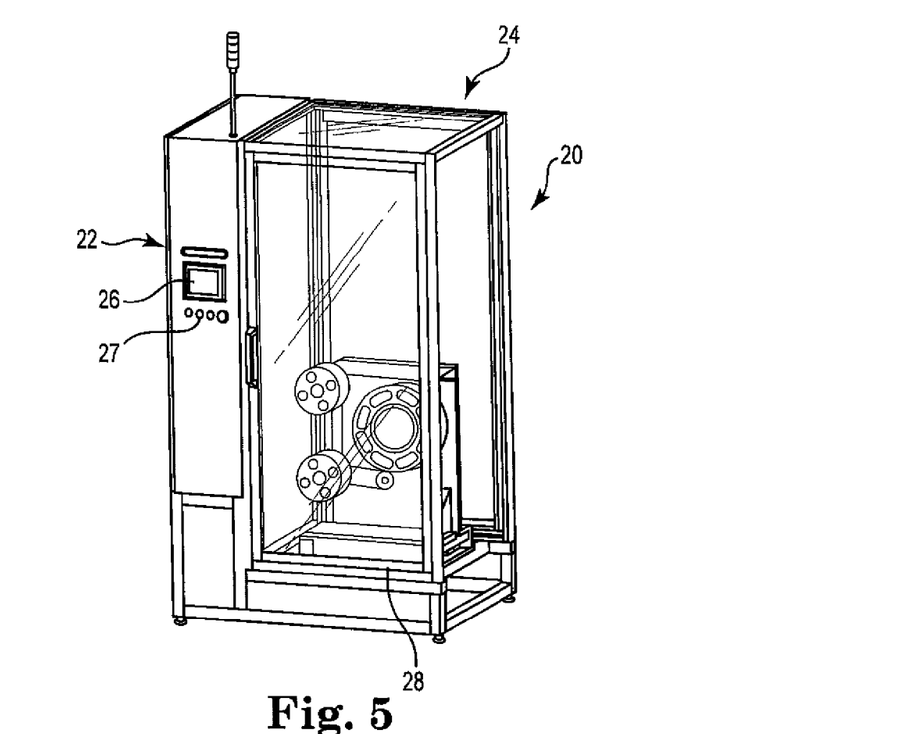
FIG. 5 is a perspective view of an unwind station of the type illustrated in FIG. 1.
Figure 6:
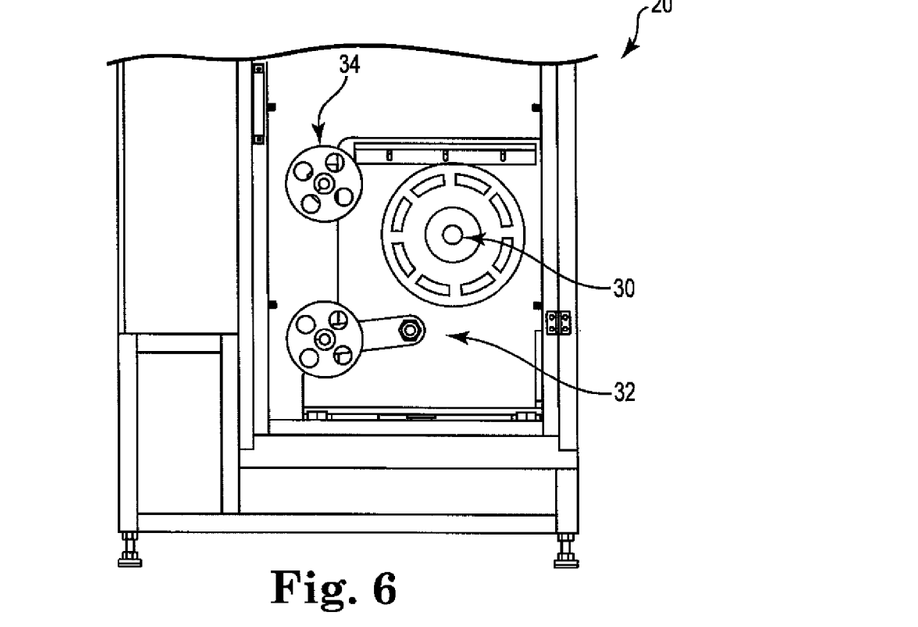
FIG. 6 is a partial front view of the unwind station of FIG. 5.
Figure 7:
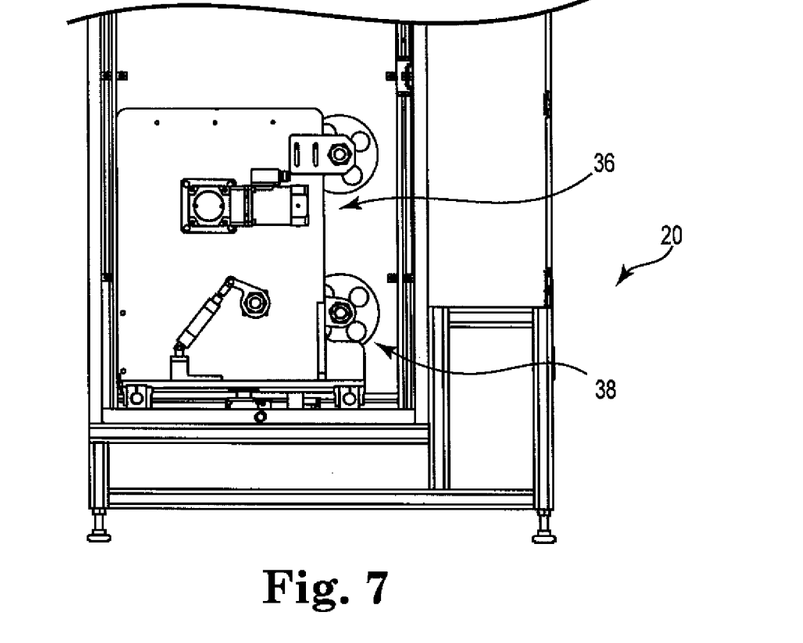
FIG. 7 is a partial rear view of the unwind station of FIG. 5.

The equipment enclosure 24 may include one or more access doors 28, each of which may include a magnetic or other detectable latch that can disable the moving equipment if the door is opened intentionally or accidentally. As is best illustrated in FIG. 6, an unwind reel 30 is provided within the equipment enclosure 24, which is sized and shaped to accept the inner core of a roll of photovoltaic elements, and which may include a mechanical expanding chuck, for example. Adjacent to the unwind reel 30 is a pivot arm dancer roller mechanism 32 that can be used for tension control and feedback for the material as it is being unwound from the reel 30. As the material continues along its processing path, it will next encounter an adjustable idler roller 34, which controls the angle for a web edge guide sensor in a downstream direction. The material unwind station 20 can further include an unwind motor 36, which is best illustrated in FIG. 7. One exemplary motor 36 for this system is an unwind AC motor with a 30:1 gearbox, although other motors can be used to unwind the material from the roll. An adjustable pneumatic, low friction, feedback cylinder 38 is also illustrated adjacent to the unwind motor 36, which can provide position feedback for controlling the tension of the photovoltaic material as it is unwound from the roll.

Figure 8:
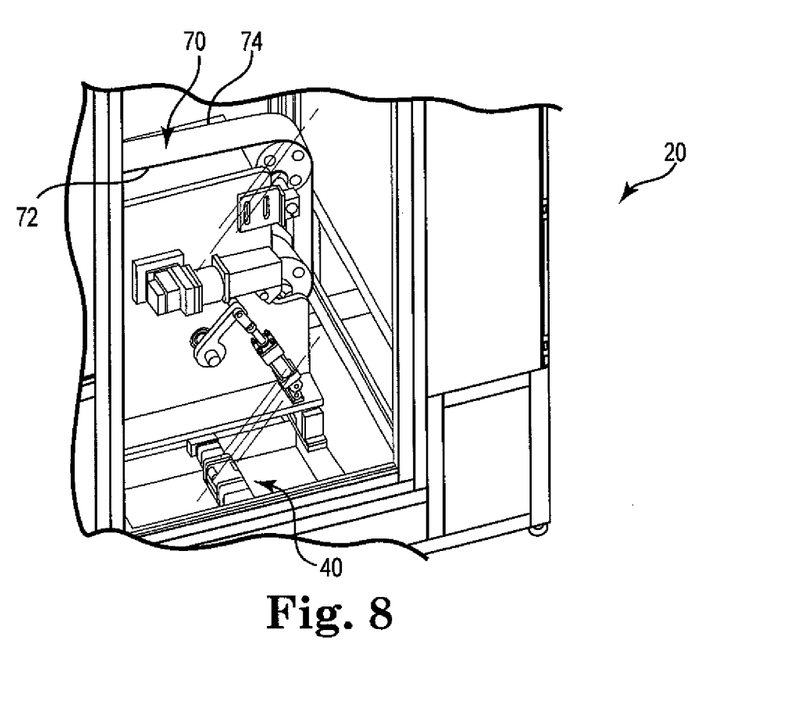
FIG. 8 is a partial perspective rear view of the unwind station of FIG. 5.
Figure 9:
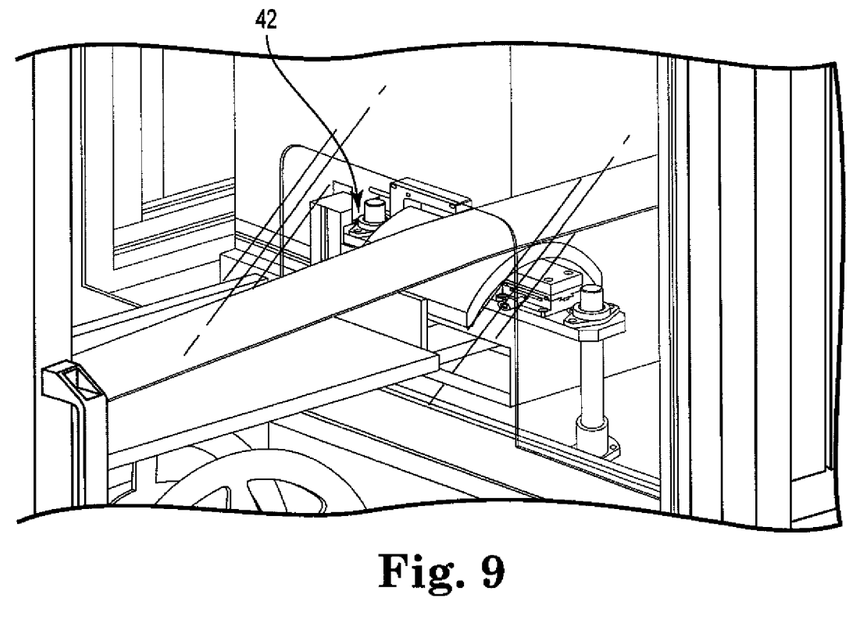
FIG. 9 is a partial perspective view of the unwind station of FIG. 5.
Figure 10:
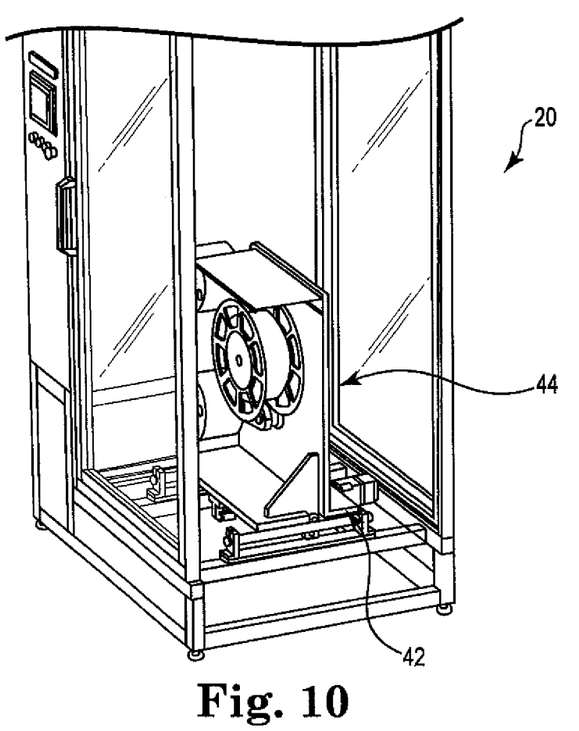
FIG. 10 is a partial side perspective view of the unwind station of FIG. 5.

FIG. 8 further illustrates a linear servo actuator 40 positioned generally on the lower side of the equipment enclosure 24, and which moves the unwinding material in a side to side direction to compensate for any telescoping of the material and/or other material movement issues. Movement of the actuator 40 can be based on input received from an edge guide sensor that is used to monitor the position of the edge of the moving material. One such exemplary edge guide sensor 42 is illustrated in FIG. 9, which includes a dynamic web edge array sensor located at the area where the roll of material exits the material unwind station 20 and enters the material dispensing station 50. To compensate for telescoping, bearing rails 42, which are illustrated in FIG. 10, can allow the entire unwind assembly 44 to translate; however, other compensation systems may instead be used.

The system may optionally comprise a system for forming a "via" in the photovoltaic element, which can be located along one or both of the longitudinal edges of the photovoltaic element from the top surface of the photovoltaic element that terminates at a location such that the via provides electrical isolation of the edge of the photovoltaic element. The process of forming vias may also be referred to as a scribing process. This process eliminates at least the top conductive and photovoltaic layers of material from the photovoltaic article near the edge so that the edge is no longer electrically connected through the top conductive layer to the remainder of the photovoltaic article. In exemplary embodiments, the scribing process removes discrete portions of the layers down to the backside electrical contact region, typically Mo. In an exemplary embodiment, the formation of the vias is carried out using a laser, but this may also be accomplished using mechanical scribing equipment. The process can be carried out to eliminate shunts that may occur due to damage or defects present on or near the edge of the photovoltaic element.

The electrically insulating material may be any such material known as being useful in the electronic arts, but preferably is a flexible material such that it won't crack as the web or cell is flexed. The material can be applied by any known method such as in the form of a tape or a liquid (e.g. a melt or solution), although certain embodiments herein are directed to the use of a liquid material. Dielectric compositions can be comprised of a wide range of materials. When applied as a liquid, the electrically insulating material may be of a type of synthetic polymer that can be deposited as a liquid and cured or cross-linked to form a solid material. Curing or cross-linking can be achieved via the application of thermal or ultraviolet (UV) energy, for example. For UV-curable compositions, it is desirable that the curing process can be carried out in a short timeframe, such as less than 10 seconds, and more specifically can be less than about 3 seconds. Many photocurable polymers require energy of at least 300 mJ/cm$^2$ and more typically about 500-1200 mJ/cm$^2$ of LTV energy in the 200-400 nm range. Exemplary embodiments include acrylate and epoxy resin based compositions. The electrically insulating material can exhibit a dielectric constant greater than about 2 and can be even greater than about 4. Exemplary electrically insulating materials have a dielectric constant greater than about 4.8 and volume resistivity greater than about $3\times10^{14}$ Ω-cm.

Figure 11:
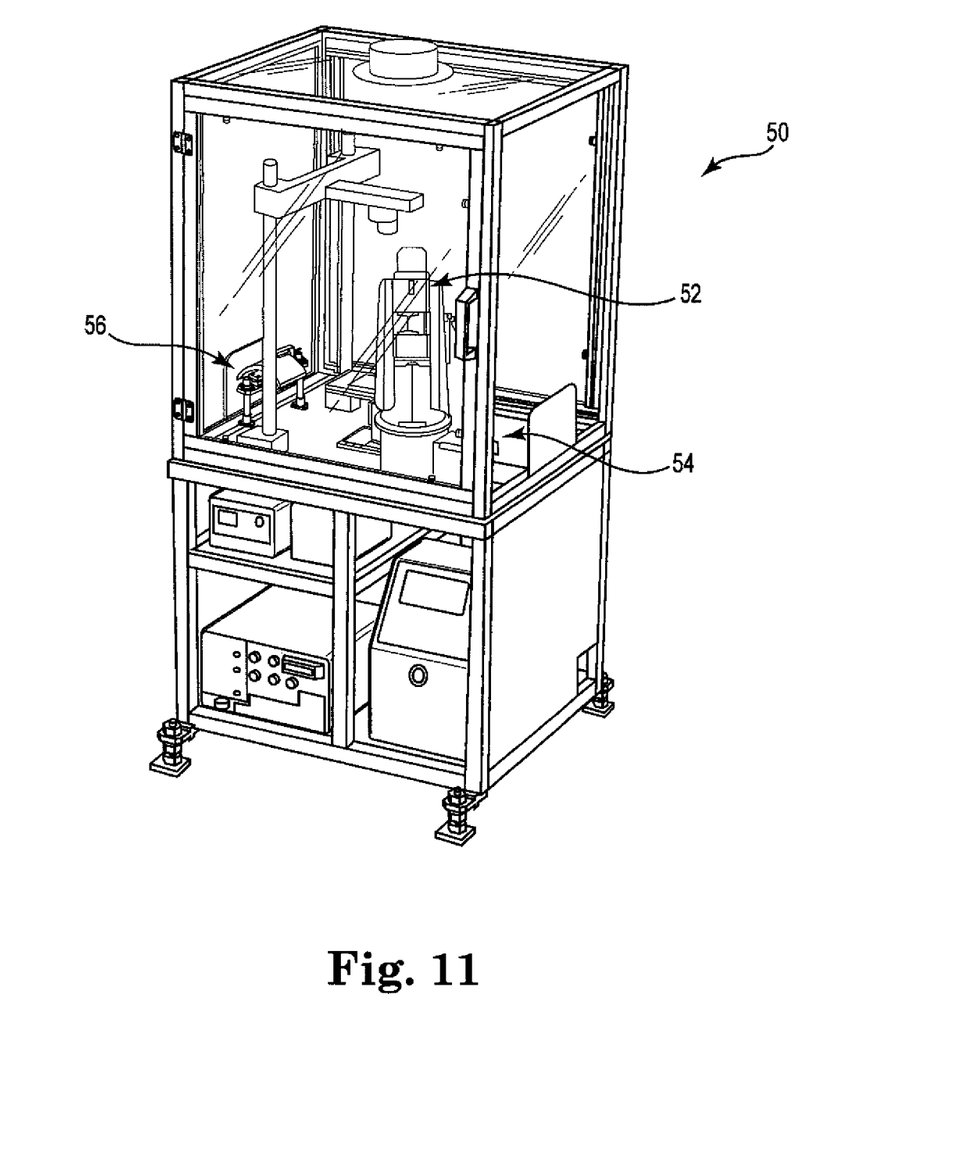
FIG. 11 is a perspective view of a material dispensing station of the type illustrated in FIG. 1.

For application of the preferred embodiment of a liquid dispensed dielectric, an exemplary liquid material dispensing station 50, which is illustrated in FIG. 11, is directly adjacent to the material unwind station 20, such that as the photovoltaic material exits the unwind station 20, it is provided to the material dispensing station 50, although it is possible that there is a gap or space provided between the stations. In this station 50, a liquid electrically insulating material can be dispensed onto the continuous flexible substrate (i.e., the photovoltaic material) in particular predetermined locations. For one example and referring to FIG. 18, the liquid electrically insulating material can be applied at discrete locations at or adjacent to the edge of the photovoltaic element, such as at one or more locations 114. The locations on which the liquid material will be placed can be determined via sensing or detecting systems that can sense certain locating features that are provided on the material itself. Locating features that can be used for determining proper electrically insulating material placement can include buss lines, for example, and/or other visually distinguishing characteristics of the flexible substrate. After such a locating feature is detected, information regarding the location can be relayed to a computer, and then the flexible substrate can be advanced or translated by a predetermined distance prior to application of the electrically insulating material and/or a timing sequence can be triggered to apply material after a certain time delay, for example.

The dispensing station 50 includes a electrically insulating material dispenser 52, which may include a dispensing unit, automation features, a curing system (e.g., a UV curing system, heating system, or other type of curing system), and/or a vision system, all of which can be coordinated to provide for accurate placement and curing of electrically insulating material on the substrate. The dispensing station 50 may further include a barcode marker and height position mechanism, illustrated generally as reference number 54. The barcode marker can be used to print identifying barcodes on the back of the moving substrate at certain intervals. For one example, each section of material that will later be classified as a separate solar cell or photovoltaic article can have its own identifying barcode printed onto its back surface, or an entire roll of material may include the same barcode in order to be able to identify from which roll each separate cell originated. The dispensing station 50 can also include a web edge guide sensor 56 that is used for sensing the edge of the web as it enters the dispensing station 50.

The electrically insulating material dispenser 52 may have a number of different exemplary embodiments, and in one embodiment, the dispenser 52 includes a robot and a jet dispensing head, which in combination can provide for accurate positioning of the dispensing head relative to the substrate on which it will be applied. The electrically insulating material can be applied in a discrete or continuous manner, and can be applied on the substrate on one side (e.g., on a top surface or a bottom surface), both sides (e.g., a top surface and a bottom surface), and/or along one or both of its edges, and can be applied as a discrete spot, as a solid line, as a broken line, or in another pattern. In addition, the electrically insulating material can be completely positioned within the edges of the substrate or can overhang one or more edges of the material. This liquid material placement can be accomplished with the use of a multi-axis robot (e.g., a six-axis robot) that is used to position the dispensing head or unit adjacent to the particular surface on which it is desired to deposit the electrically insulating material. The material dispensing can be accomplished by a contact process, in which a component of the material dispenser 52 actually contacts the substrate, or by a non-contact process, in which no part of the material dispenser 52 contacts the substrate during the liquid material dispensing process. In one embodiment, the dispensing unit provides the materials as a multiple droplet array of liquid electrically insulating material applied via a non-contact process, such as jet-dispensing.

Figure 12:
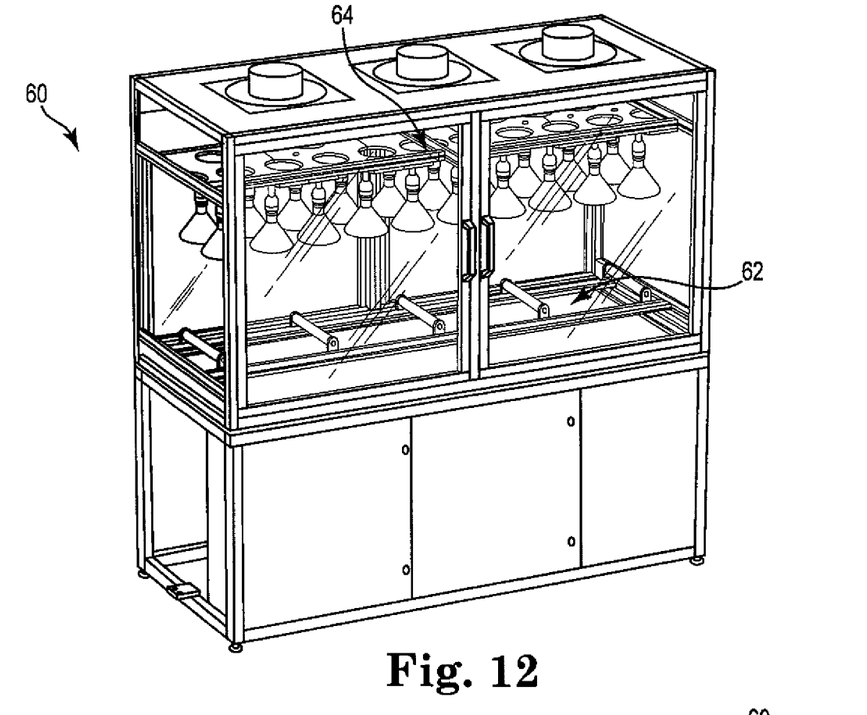
FIG. 12 is a perspective view of the light soaking station of the type illustrated in FIG. 11.
Figure 13:
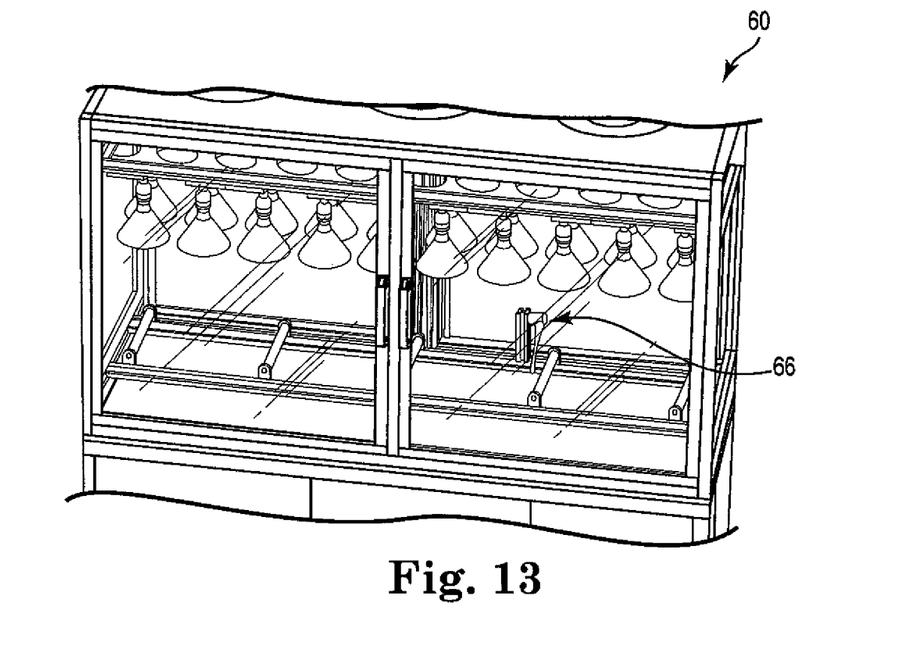
FIG. 13 is a partial perspective view of the light soaking station of FIG. 12.

An exemplary light soaking station 60, which is illustrated in FIGS. 12 and 13, is adjacent to the material dispensing station 50, such that as the material exits the material dispensing station 50, it is provided to the light soaking station 60. Light soaking station 60 generally includes a series of idler rollers 62 over which the flexible substrate moves while a series of lights or a lamp array 64 projects energy to the substrate. Although twenty lights are illustrated in the lamp array 64, it is understood that more or less lights or lamps can be provided. Station 60 can further include a temperature monitoring and controlling system that includes a temperature sensor 66, which can be an open loop system, for example. The number and intensity of lights can be variable and controllable, such that the light intensity of each light can be individually controlled, the number of lights turned on at any given time can be varied, and/or the intensity of one or more lamps of the light array can be varied. In one particular example, the irradiation energy provided by the lamp array can be in the range of approximately 700 $W/m^2$ to approximately 2000 $W/m^2$. In an exemplary embodiment, the intensity is set to approximately 1000 $W/m^2$, and is within +/−5% of this value over the area of the surface of the photovoltaic element in the light soak station. The light soaking process provides brief simulation of solar irradiation prior to solar cell testing, so that the measured photoelectric performance of each individual photovoltaic article will more accurately reflect the photoelectrical performance of devices that are active in the field during extended solar irradiation. The photoelectric performance of the resulting classified photovoltaic articles can be more accurately measured so that bins or stacks of photovoltaic articles with ideally matched photoelectric performance can be prepared.

Figure 14:
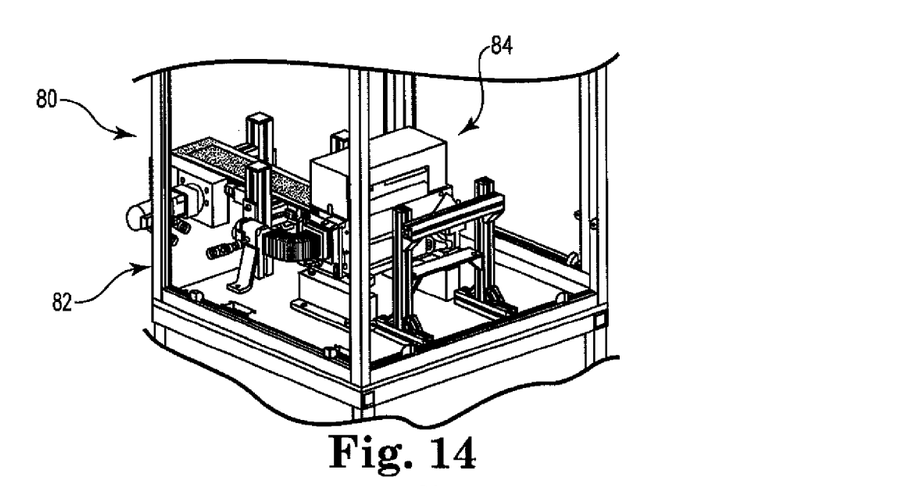
FIG. 14 is a partial perspective view of a shear station of the type illustrated in FIG. 1.
Figure 15:
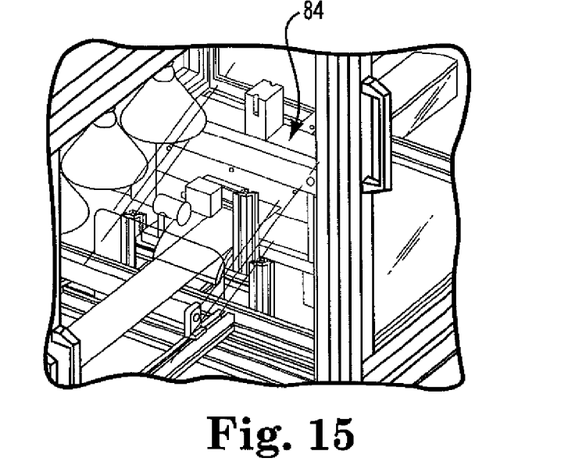
FIG. 15 is a partial perspective view of the shear station of FIG. 14.
Figure 16:
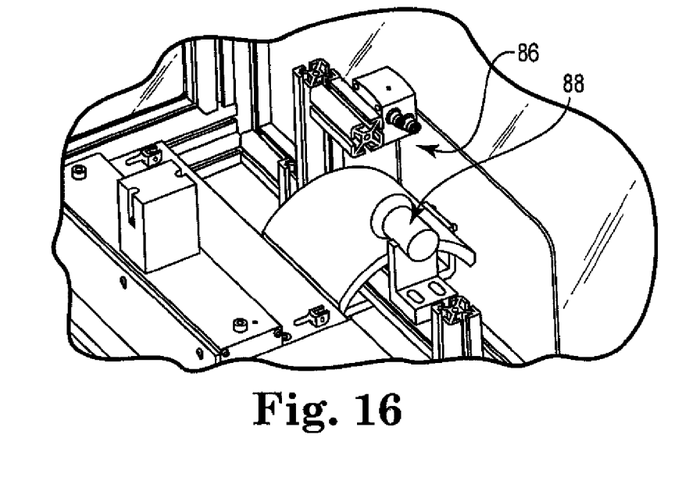
FIG. 16 is a partial perspective view inside the enclosure of the shear station of FIG. 14.
Figure 17:
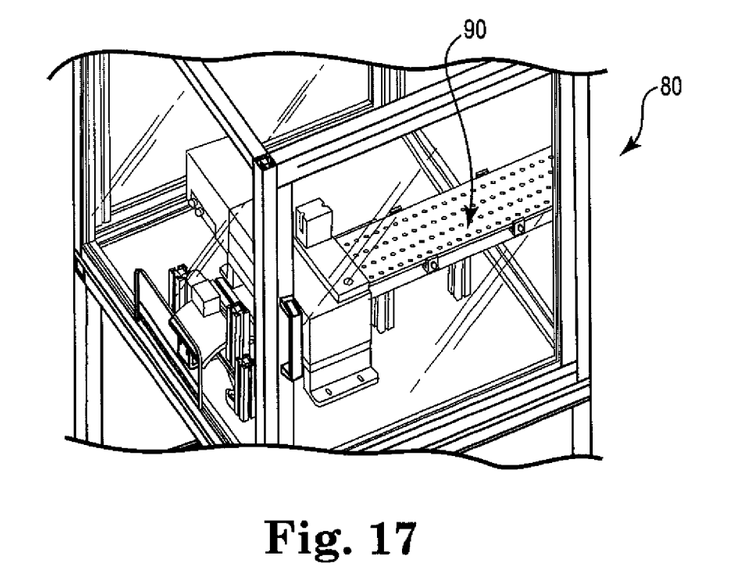
FIG. 17 is another partial perspective view of the shear station of FIG. 14.

An exemplary shearing station 80, which is illustrated in FIGS. 14-16, is adjacent to the light soaking station 60, such that as the material exits the light soaking station 60, it is provided to the shearing station 80. Shearing station 80 generally includes an enclosure 82 into which the continuous flexible substrate enters after it has optionally been subjected to the light soaking process. Individual cells can be cut or separated from the continuous material rolls in this station, which can be accomplished using a driven nip and shear system 84, along with a registration system that can identify the exact positioning of the material passing through the system. This process may be referred to as a "singulation" process. The shear system 84 may be any of a number of different devices and mechanisms that provide for clean cutting of the material from the roll of photovoltaic material.

The shearing station 80 may also include a registration mark sensor 86 that can detect the position of a particular portion of the material as it passes by it, such as the buss bars of the photovoltaic material, for example. As the identified portion of the substrate passes the sensor 86, the location of the cell is recorded and can trigger the shearing process to occur. In addition, the shearing station 80 can include a wheel encoder 88 that rides along the top surface of the continuous substrate to confirm that the correct length of material has passed by or through it. The shearing station 80 may further include an offload vacuum conveyor 90 that holds and conveys the individual cells after they have been cut from the continuous material roll. That is, after the material is cut by any known or developed shearing equipment and process (not shown), the vacuum conveyor 90 can be used to hold the individual cells in place and move them to the next station or location.

Figure 19:
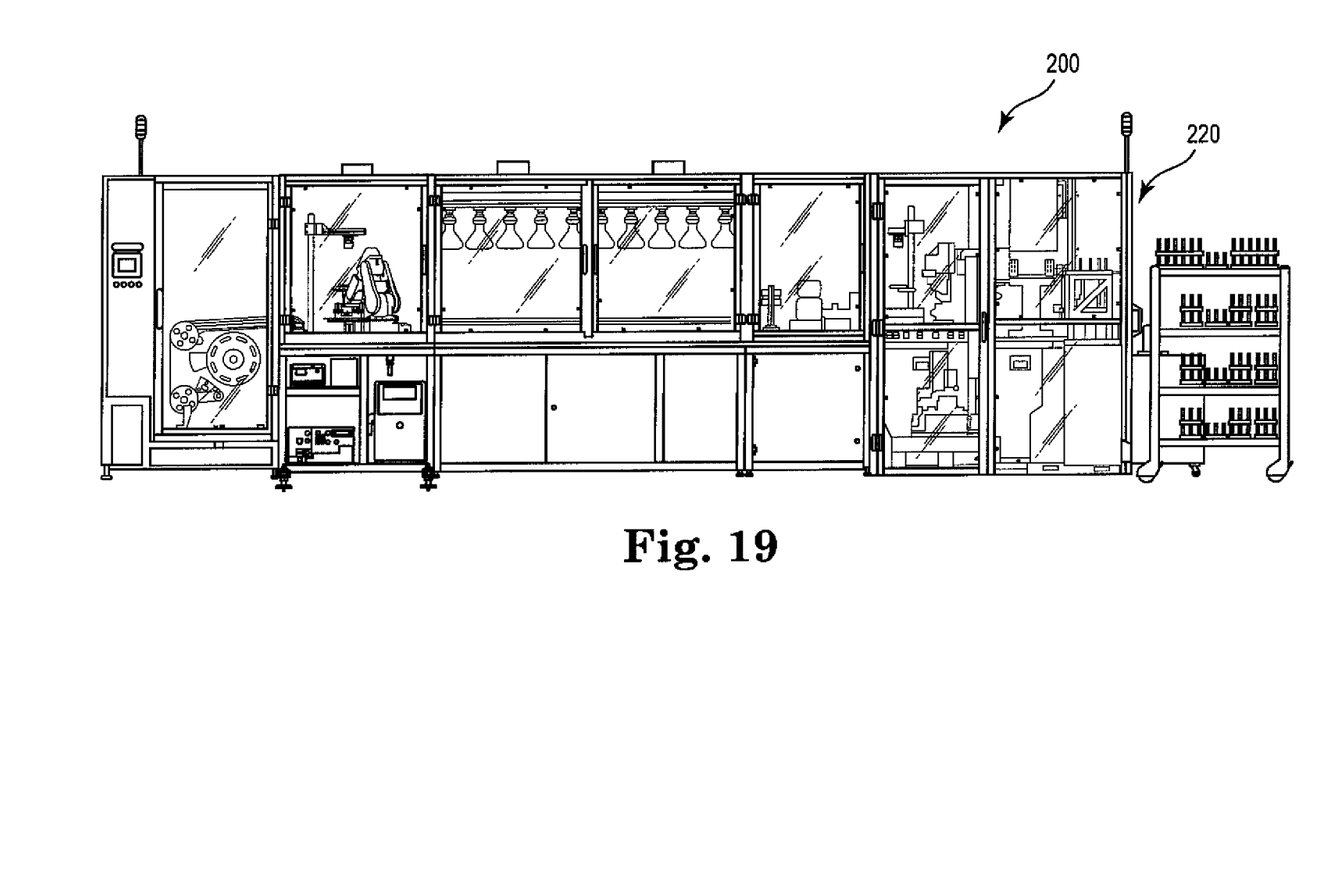
FIG. 19 is a front view of another embodiment of a thin film solar cell processing and classifying system, in accordance with the invention.
Figure 20:
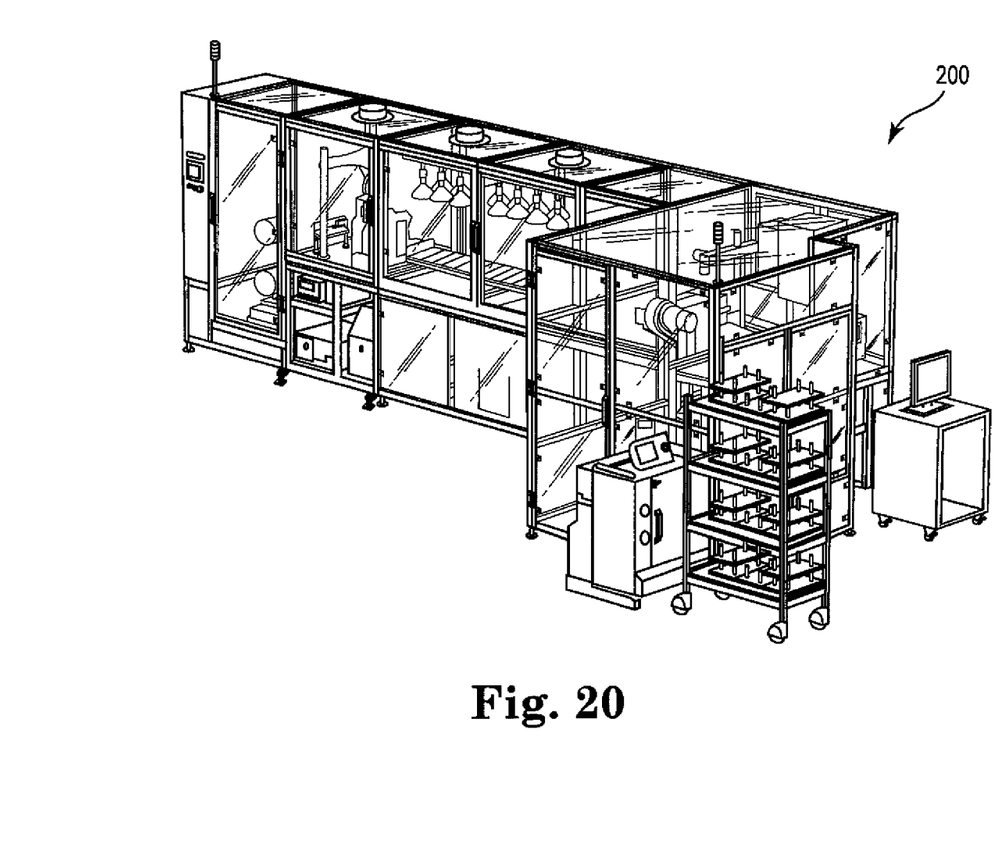
FIG. 20 is a perspective view of the processing and classifying system of FIG. 19.
Figure 21:
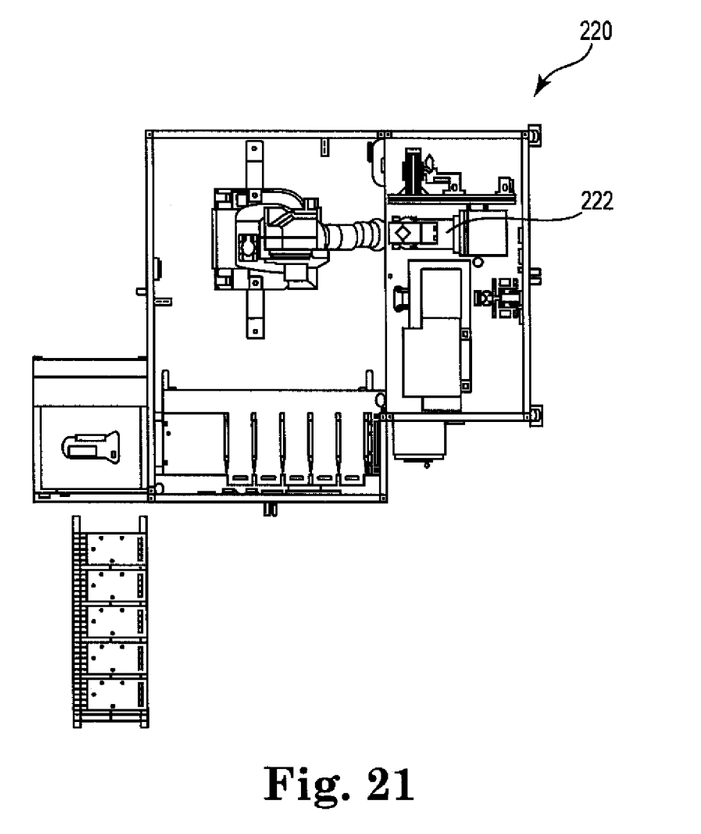
FIG. 21 is a top view of a portion of the system of FIG. 19.

In order to determine the efficiency of each of the individual cells, the cells can be transferred to a solar simulator testing station 220, as is illustrated relative to the exemplary thin film solar cell processing and classifying system 200 of FIGS. 19-21. The transfer of solar cells to the test station 220 can be accomplished via the use of a multi-axis robot, for example. The testing station can further comprise a test nest 222 comprising a conductive plate for contacting the back conductive substrate of the solar cell with holes for the application of vacuum to hold the cells in place during the test. A series of conductive elements (e.g., "pogo pins") can contact the top of the cells while a solar simulator lamp flashes at approximately the same time. The photoelectric performance of the solar cell can be measured at this time. The pogo pins may contact the top surface of the solar cell at the location of buss lines if they are present on the solar cell. A vision system may also be present for detection of positional features such as the buss lines so that the multi-axis robot may provide the solar cell to the test nest in an accurate orientation for contacting the pogo pins. In one embodiment, the reader determines the efficiency by measuring the current-voltage characteristics of the cells. A robot can then pick up the cell and place it in a particular location based on its photoelectric performance.

Although the above description relates to a single roll of material being provided to the processing equipment, processed, and cut into individual cells, it is contemplated that the equipment can be designed to accommodate processing of two or more rolls of material simultaneously, such as with duplicate components in some or all of the stations. For example, the material unwind station can include multiple unwind rolls, each of which accommodates its own roll of material. In some cases, a single station can have at least one component that services two or more rolls of material. For example, the dispensing system of a material dispensing station may include a single robot that is able to apply liquid electrically insulating material to multiple rolls of material, such as may be accomplished with a robot having a large enough range to access the predetermined locations of multiple photovoltaic elements or with a system comprising more than one dispensing head, for example.

Further, the above description is directed to one embodiment of the steps involved in an exemplary method of processing and classifying thin film solar cells of the invention; however, it is understood that the steps can be performed in a different order than described above, which could involve rearranging, eliminating, or adding stations to the system. For one example, the light-soaking step can occur after the individual cells are separated from the continuous flexible substrate. For another example, a photocurable electrically insulating material can be used, such that the light soaking and curing of the material can occur simultaneously.

The present invention has now been described with reference to at least one embodiment thereof. The contents of any patents or patent application cited herein are incorporated by reference in their entireties. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

What is claimed is:
1. A method of providing a plurality of classified photovoltaic articles, comprising the steps of:
providing a first photovoltaic element comprising a plurality of photovoltaic articles on a continuous flexible substrate;

forming an electrically insulating material on the first photovoltaic element at one or more predetermined locations;

separating adjacent photovoltaic articles from each other after the step of forming the electrically insulating material on the first photovoltaic element;

determining an efficiency of each photovoltaic article by measuring its current-voltage characteristics after the step of forming the electrically insulating material on the first photovoltaic element;

classifying each photovoltaic article according to its photoelectrical performance after the step of determining its efficiency;

providing at least one additional photovoltaic element adjacent to the first photovoltaic element, each of the additional photovoltaic elements comprising a plurality of photovoltaic articles on a continuous flexible substrate;

forming an electrically insulating material on each of the additional photovoltaic elements at one or more predetermined locations;

separating adjacent photovoltaic articles of each of the additional photovoltaic elements from each other;

determining an efficiency of each photovoltaic article of each of the additional photovoltaic elements by measuring its current-voltage characteristics; and classifying each photovoltaic article of each of the additional photovoltaic elements according to its photoelectric performance.

2. The method of claim 1, further comprising a step of light soaking the photovoltaic articles prior to the step of determining their efficiencies.

3. The method according to claim 1, further comprising a step of curing the electrically insulating material after the step of forming the electrically insulating material on the first photovoltaic element.

4. The method according to claim 1, wherein the step of forming the electrically insulating material comprises forming a multiple droplet array of electrically insulating material on at least one of an edge surface of the first photovoltaic element, a top surface of the first photovoltaic element, and a bottom surface of the first photovoltaic element.

5. The method according to claim 1, wherein the step of forming the electrically insulating material on the first photovoltaic element comprises using a multi-axis system for positioning a dispensing unit adjacent to at least one surface of the first photovoltaic element.

6. The method of claim 1, further comprising a step of placing each photovoltaic article in a predetermined location according to its photoelectrical performance.

7. The method of claim 1, wherein the first photovoltaic element is provided in a roll configuration and further comprising a step of unwinding the roll prior to forming the electrically insulating material on the first photovoltaic element.

8. The method according to claim 1, wherein a surface of the first photovoltaic element comprises at least one locating feature, and further comprising the step of detecting the at least one locating feature prior to the step of forming the electrically insulating material on the first photovoltaic element.

9. The method according to claim 1, wherein each of the plurality of photovoltaic articles of the first photovoltaic element comprises an electrical collection structure, a first end, and a second end, wherein the first and second ends of each photovoltaic article are on opposite ends of its collection structure.

10. The method of claim 8, further comprising the step of detecting the at least one locating feature and traversing the first photovoltaic element by a predefined distance prior to the step of separating adjacent photovoltaic articles from each other and prior to the step of forming the electrically insulating material on the first photovoltaic element.

11. The method according to claim 1, further comprising the step of forming vias in the first photovoltaic element along at least one of a first and second longitudinal edge of the first photovoltaic element from the top surface of the first photovoltaic element that terminates at a location such that each via provides electrical isolation of at least one of the edges of the first photovoltaic element.

12. The method according to claim 4, wherein the step of forming the electrically insulating material further comprises forming the multiple droplet array with a non-contact dispensing process.

13. The method according to claim 1, wherein the at least one additional photovoltaic element comprises a second photovoltaic element, and wherein the first and second photovoltaic elements are provided as a first roll and a second roll, respectively, and further comprising a step of simultaneously unwinding the first and second rolls prior to the step of forming the electrically insulating material on the first and second photovoltaic elements.

14. The method according to claim 9, wherein the first photovoltaic element further comprises first and second linear edges that extend along a length of the first photovoltaic element, and wherein each electrical collection structure comprises at least one buss line that is generally perpendicular to the first and second linear edges of the first photovoltaic element.

15. The method according to claim 14, further comprising the step of detecting at least one buss line prior to the step of forming the electrically insulating material on the first photovoltaic element.

16. The method according to claim 14, wherein each electrical collection structure further comprises a plurality of fingers extending in a generally perpendicular direction to the at least one buss line.

* * * * *